(12) United States Patent
Ikeda et al.

(10) Patent No.: US 11,355,326 B2
(45) Date of Patent: Jun. 7, 2022

(54) PLASMA PROCESSING APPARATUS AND CONTROL METHOD

(71) Applicant: TOKYO ELECTRON LIMITED, Tokyo (JP)

(72) Inventors: Taro Ikeda, Nirasaki (JP); Mikio Sato, Nirasaki (JP); Eiki Kamata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/942,158

(22) Filed: Jul. 29, 2020

(65) Prior Publication Data

US 2021/0035788 A1 Feb. 4, 2021

(30) Foreign Application Priority Data

Aug. 1, 2019 (JP) .............................. JP2019-142497

(51) Int. Cl.
*H01J 37/32* (2006.01)

(52) U.S. Cl.
CPC .. *H01J 37/32954* (2013.01); *H01J 37/32192* (2013.01); *H01J 2237/24507* (2013.01); *H01J 2237/24585* (2013.01)

(58) Field of Classification Search
CPC ........... H01J 37/32192; H01J 37/32954; H01J 2237/24507; H01J 2237/24585
See application file for complete search history.

(56) References Cited

U.S. PATENT DOCUMENTS

| 2004/0177922 A1* | 9/2004 | Fink ................... H01J 37/32935 156/345.24 |
| 2009/0061542 A1* | 3/2009 | Patrick ................... G01N 17/04 438/10 |
| 2018/0301388 A1* | 10/2018 | Ikeda ................. H01L 21/02274 |

FOREIGN PATENT DOCUMENTS

| JP | 2018-181633 A | 11/2018 |
| KR | 10-2009-0031746 A | 3/2009 |
| KR | 10-2018-0116143 A | 10/2018 |

* cited by examiner

*Primary Examiner* — Yuechuan Yu
(74) *Attorney, Agent, or Firm* — Fenwick & West LLP (57) ABSTRACT

A plasma processing apparatus includes a processing chamber, a conductive annular member, a microwave radiating mechanism and a plasma detector. The processing chamber has a ceiling plate with an opening. The conductive annular member is disposed at the opening while being insulated from the ceiling plate. The microwave radiating mechanism is disposed on the ceiling plate to be coaxial with a center of the conductive annular member and configured to radiate microwaves into the processing chamber. Further, a plasma detector is connected to the conductive annular member and configured to detect a state of generated plasma.

15 Claims, 6 Drawing Sheets

PLASMA PROCESSING APPARATUS AND CONTROL METHOD

CROSS-REFERENCE TO RELATED APPLICATION

This application claims priority to Japanese Patent Application No. 2019-142497, filed on Aug. 1, 2019, the entire contents of which are incorporated herein by reference.

TECHNICAL FIELD

The present disclosure relates to a plasma processing apparatus and a control method.

BACKGROUND

There is known a technique for monitoring at least one of an electron density and an electron temperature of plasma generated in a processing chamber by providing a probe projecting from a wall surface of the processing chamber toward an inner space of the processing chamber in a radial direction of the processing chamber (see, e.g., Japanese Patent Application Publication No. 2018-181633).

The present disclosure provides a technique capable of monitoring a plasma state.

SUMMARY

In accordance with an aspect of the present disclosure, there is provided a plasma processing apparatus including: a processing chamber having a ceiling plate with at least one opening; at least one conductive annular member respectively disposed at the at least one opening while being insulated from the ceiling plate; at least one microwave radiating mechanism respectively disposed on the ceiling plate to be coaxial with a center of each of the at least one conductive annular member and configured to radiate microwaves into the processing chamber; and a plasma detector connected to each of the at least one conductive annular member and configured to detect a state of generated plasma.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of the present disclosure that are not restrictive but illustrative will be described in detail with reference to the accompanying drawings. Like reference numerals will be given to like or corresponding parts throughout the drawings and redundant description thereof will be omitted.

(Microwave Plasma Processing Apparatus)

Figure 1:
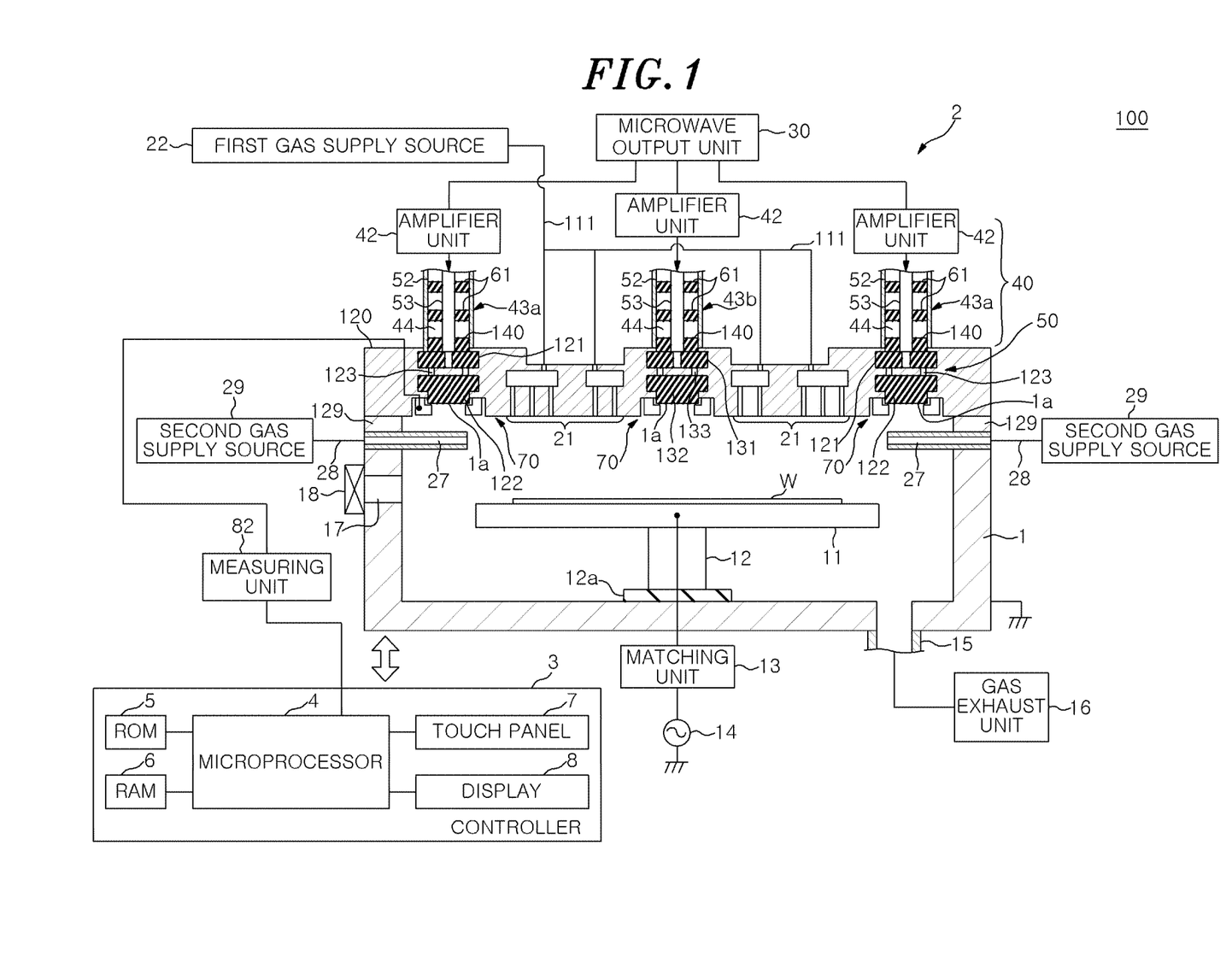
FIG. 1 shows an example of a vertical cross section of a microwave plasma processing apparatus according to an embodiment.

FIG. 1 shows an example of a cross section of a microwave plasma processing apparatus 100 according to an embodiment. The microwave plasma processing apparatus 100 includes a chamber 1 for accommodating a semiconductor wafer (hereinafter referred to as "wafer W"). The microwave plasma processing apparatus 100 is an example of a plasma processing apparatus for performing predetermined plasma processing on the wafer W by surface wave plasma formed on a surface of the chamber 1 by microwaves. The predetermined plasma processing may be, e.g., film formation or etching.

The chamber 1 is an airtight processing container formed in a substantially cylindrical shape and made of a metal such as aluminum, stainless steel, or the like. The chamber 1 is grounded. A microwave plasma source 2 is disposed to face the inside of the chamber 1 through an opening 1a formed at an inner wall of a ceiling plate of the chamber 1. When microwaves are introduced from the microwave plasma source 2 into the chamber 1 through the opening 1a, the surface wave plasma is formed in the chamber 1.

A wafer support 11 for placing thereon the wafer W is disposed in the chamber 1. The wafer support 11 is supported by a cylindrical supporting member 12 extending upward from a bottom center of the chamber 1 through an insulating member 12a. The wafer support 11 and the support member 12 may be made of a metal such as aluminum having an alumite-treated (anodically oxidized) surface or may be made of an insulating member (ceramic or the like) having therein a high frequency electrode. The wafer support 11 may be provided with an electrostatic chuck for attracting and holding the wafer W, a temperature control mechanism, a gas flow path for supplying a heat transfer gas to a backside of the wafer W, and the like.

A radio frequency bias power supply 14 is electrically connected to the wafer support 11 through a matching unit 13. By supplying a radio frequency power from the radio frequency bias power supply 14 to the wafer support 11, ions in the plasma are attracted toward the wafer W. The radio frequency bias power supply 14 may not be provided depending on the characteristics of plasma processing.

A gas exhaust line 15 is connected to the bottom portion of the chamber 1. A gas exhaust unit 16 including a vacuum pump is connected to the gas exhaust line 15. When the gas exhaust unit 16 is driven, a gas in the chamber 1 is exhausted and a pressure in the chamber 1 is rapidly reduced to a predetermined vacuum level. A loading/unloading port 17 for loading and unloading the wafer W and a gate valve 18 for opening and closing the loading/unloading port 17 are disposed at a sidewall of the chamber 1.

The microwave plasma source 2 includes a microwave output unit 30, a microwave transmitting unit 40, and microwave radiation mechanisms 50. The microwave output unit 30 distributes and outputs microwaves through a plurality of channels.

The microwave transmitting unit 40 transmits the microwaves outputted from the microwave output unit 30. The microwave transmitting unit 40 includes peripheral microwave introducing mechanisms 43a and a central microwave introducing mechanism 43b, each having a function of introducing the microwaves outputted from amplifier units 42 into the microwave radiation mechanisms 50 and a function of matching an impedance.

In each of the peripheral microwave introducing mechanisms 43a and the central microwave introducing mechanism 43b, a cylindrical outer conductor 52 and a rod-shaped inner conductor 53 inserted therein are coaxially arranged. A microwave transmitting path 44, to which a microwave power is supplied and through which microwaves propagate toward the microwave radiation mechanisms 50, is formed between the outer conductor 52 and the inner conductor 53.

Each of the peripheral microwave introducing mechanisms 43a and the central microwave introducing mechanism 43b is provided with slugs 61 and an impedance adjusting member 140 disposed at a leading end thereof. By moving the slugs 61, an impedance of a load (plasma) in the chamber 1 is matched with a characteristic impedance of a microwave power supply in the microwave output unit 30. The impedance adjusting member 140 is made of a dielectric material and is configured to adjust an impedance of the microwave transmitting path 44 by a relative dielectric constant thereof.

The microwave radiation mechanisms 50 that are hermetically sealed are disposed on a support ring 129 disposed at an upper portion of the chamber 1. Further, the microwave radiation mechanisms 50 radiate the microwaves that are outputted from the microwave output unit 30 and transmitted by the microwave transmitting unit 40 into the chamber 1. The microwave radiation mechanisms 50 are disposed at the ceiling plate of the chamber 1 and form a part of a ceiling.

The microwave radiation mechanisms 50 are provided in a main body 120 and each of the microwave radiation mechanisms 50 includes a wave retardation member 121 or 131, a microwave transmitting member 122 or 132, and slots 123 or 133. The main body 120 is made of a metal.

Figure 2:
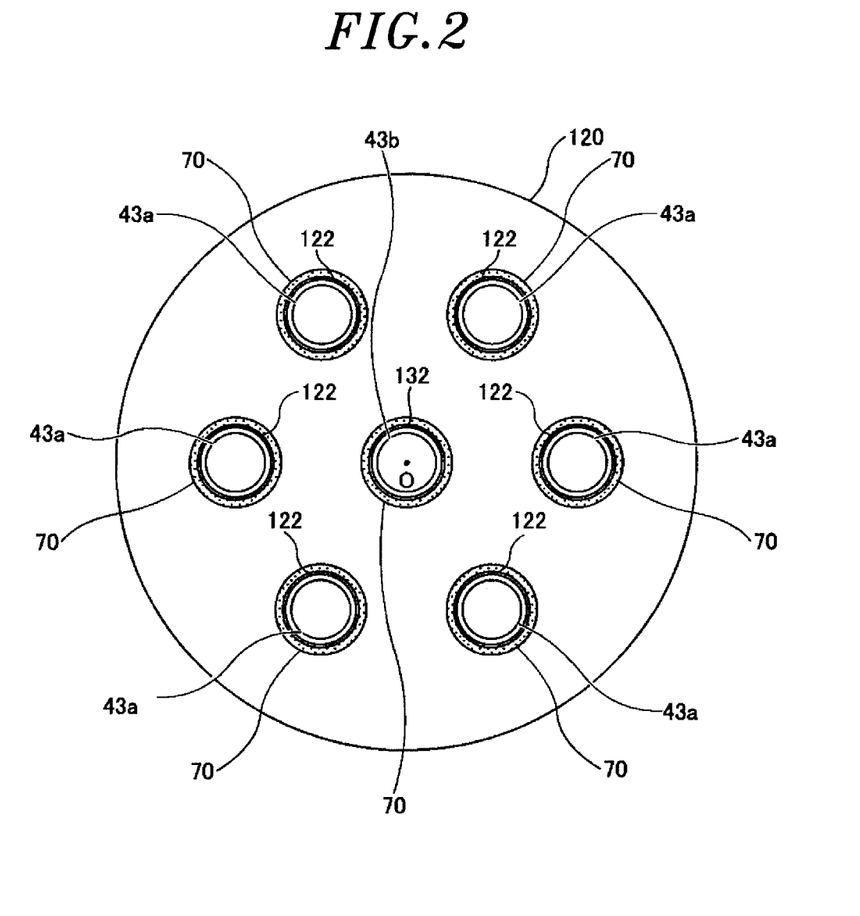
FIG. 2 shows an example of an inner wall of a ceiling plate of the microwave plasma processing apparatus according to the embodiment.

In the main body 120, the microwave radiation mechanisms 50 are connected to six peripheral microwave introducing mechanisms 43a and one central microwave introducing mechanism 43b. FIG. 2 shows an example of an inner wall of the ceiling plate of the microwave plasma processing apparatus 100 according to the embodiment. In FIG. 2, gas supply holes are not illustrated. As shown in FIG. 2, the six peripheral microwave introducing mechanisms 43a are arranged at equal intervals in a circumferential direction at an outer peripheral portion of the ceiling plate (the main body 120) of the chamber 1. One central microwave introduction mechanism 43b is arranged at the center of the ceiling plate of the chamber 1.

Referring back to FIG. 1, the wave retardation members 121 are fitted in the main body 120 while being respectively connected to the peripheral microwave introducing mechanism 43a. The wave retardation member 131 is fitted in the main body 120 while being connected to the central microwave introduction mechanism 43b. The wave retardation members 121 and 131 are made of a disc-shaped dielectric member that transmits microwaves. The wave retardation members 121 and 131 have a relative dielectric constant greater than that of a vacuum, and may be made of, e.g., quartz, ceramic such as alumina ($Al_2O_3$) or the like, a fluorine-based resin such as polytetrafluoroethylene or the like, or a polyimide-based resin. Since the microwaves have a long wavelength in the vacuum, the wave retardation members 121 and 131 are made of a material whose relative dielectric constant is greater than that of the vacuum, so that a size of an antenna having slots 123 and 133 can be reduced by shortening the wavelength of the microwaves.

Below each wave retardation member 121 (or 131), a disc-shaped microwave transmitting member 122 (or 132) is fitted in the main body 120. The slots 123 are formed between the wave retardation member 121 and the microwave transmitting member 122. The slots 133 are formed between the wave retardation member 131 and the microwave transmitting member 132.

The microwave transmitting members 122 and 132 are made of a dielectric material that transmits microwaves.

As shown in FIG. 2, in one embodiment, six microwave transmitting members 122 respectively corresponding to the six peripheral microwave introducing mechanisms 43a are arranged at equal intervals in the circumferential direction in the main body 120 and exposed in a circular shape to the inside of the chamber 1. Further, one microwave transmitting member 132 corresponding to the central microwave introducing mechanism 43b is exposed in a circular shape to the inside of the chamber 1 at the center of the ceiling plate of the chamber 1.

The microwave transmitting members 122 and 132 function as dielectric windows for generating surface wave plasma uniformly in the circumferential direction. The microwave transmitting members 122 and 132 may be made of, e.g., quartz, ceramic such as alumina ($Al_2O_3$), a fluorine-based resin such as polytetrafluoroethylene, or a polyimide-based resin, similarly to the wave retardation members 121 and 131.

Each of the microwave transmitting members 122 and 132 is provided with a probe 70. The probe 70 is an annular ring probe and is disposed at an outer peripheral portion of each of the microwave transmitting members 122 and 132. The probe 70 will be described later.

Although the six peripheral microwave introducing mechanisms 43a are illustrated in the embodiment, there may be N-number of peripheral microwave introducing mechanisms 43a. N may be 2 or more, and preferably 3 or more, e.g., 3 to 6.

Referring back to FIG. 1, the main body 120 includes first gas inlet units 21 each having a shower structure, and the first gas inlet units 21 are connected to a first gas supply source 22 through gas supply lines 111. A first gas supplied from the first gas supply source 22 is supplied into the chamber 1 in a shower pattern through the first gas inlet units 21. The first gas inlet units 21 is a first gas shower head for supplying the first gas at a first height from a plurality of gas holes formed in the ceiling portion of the chamber 1. The first gas includes a gas for plasma generation such as Ar gas, and a gas to be decomposed with high energy such as $O_2$ gas and $N_2$ gas.

Gas supply nozzles 27 that are examples of a second gas inlet unit are disposed between the wafer support 11 and the microwave radiation mechanisms 50 in the chamber 1. The gas supply nozzles 27 project horizontally from the sidewall of the chamber 1 toward the inside of the chamber 1. Second gas supply sources 29 are connected to the gas supply nozzles 27 through gas supply lines 28.

From the second gas supply sources 29, a second gas such as $SiH_4$ gas, $C_5F_8$ gas that is a processing gas, desired to be supplied without decomposition during the plasma processing such as film formation, etching or the like, is supplied. The gas supply nozzles 27 are configured to supply the second gas from a plurality of gas holes at a height lower than a height of the plurality of gas holes for supplying the first gas from the first gas supply source 22. Various gases can be used as the gases supplied from the first gas supply source 22 and the second gas supply sources 29 depending on the contents of the plasma processing.

The respective components of the microwave plasma processing apparatus 100 are controlled by a controller 3. The controller 3 includes a microprocessor 4, a read only memory (ROM) 5, and a random access memory (RAM) 6. The ROM 5 and the RAM 6 store therein a process sequence and a process recipe that is a control parameter of the microwave plasma processing apparatus 100. The microprocessor 4 controls the respective components of the microwave plasma processing apparatus 100 based on the process sequence and the process recipe. Further, the controller 3 includes a touch panel 7 and a display 8 so that it is possible to input commands or display results at the time of performing a predetermined control based on the process sequence and process recipe.

When the plasma processing is performed in the microwave plasma processing apparatus 100, first, the wafer W held on a transfer arm (not shown) is loaded into the chamber 1 from the opened gate valve 18 through the loading/unloading port 17. The gate valve 18 is closed after the wafer W is loaded. When the wafer W is transferred to a position above the wafer support 11, the wafer W is transferred from the transfer arm to pusher pins (not shown) and then placed on the wafer support 11 as the pusher pins are lowered. A pressure in the chamber 1 is maintained at a predetermined vacuum level by the gas exhaust unit 16. The first gas is introduced into the chamber 1 in a shower pattern from the first gas inlet unit 21, and the second gas is introduced into the chamber 1 in a shower pattern from the gas supply nozzles 27. The microwaves are radiated from the respective microwave radiating mechanisms 50 connected to the bottom surfaces of the six peripheral microwave introducing mechanisms 43a and the central microwave introducing mechanism 43b through the peripheral microwave introducing mechanisms 43a and the central microwave introducing mechanism 43b. Accordingly, the first gas and the second gas are decomposed, and the wafer W is subjected to plasma processing by the surface wave plasma generated on the surface of the chamber 1.

(Microwave Plasma Source)

Figure 3:
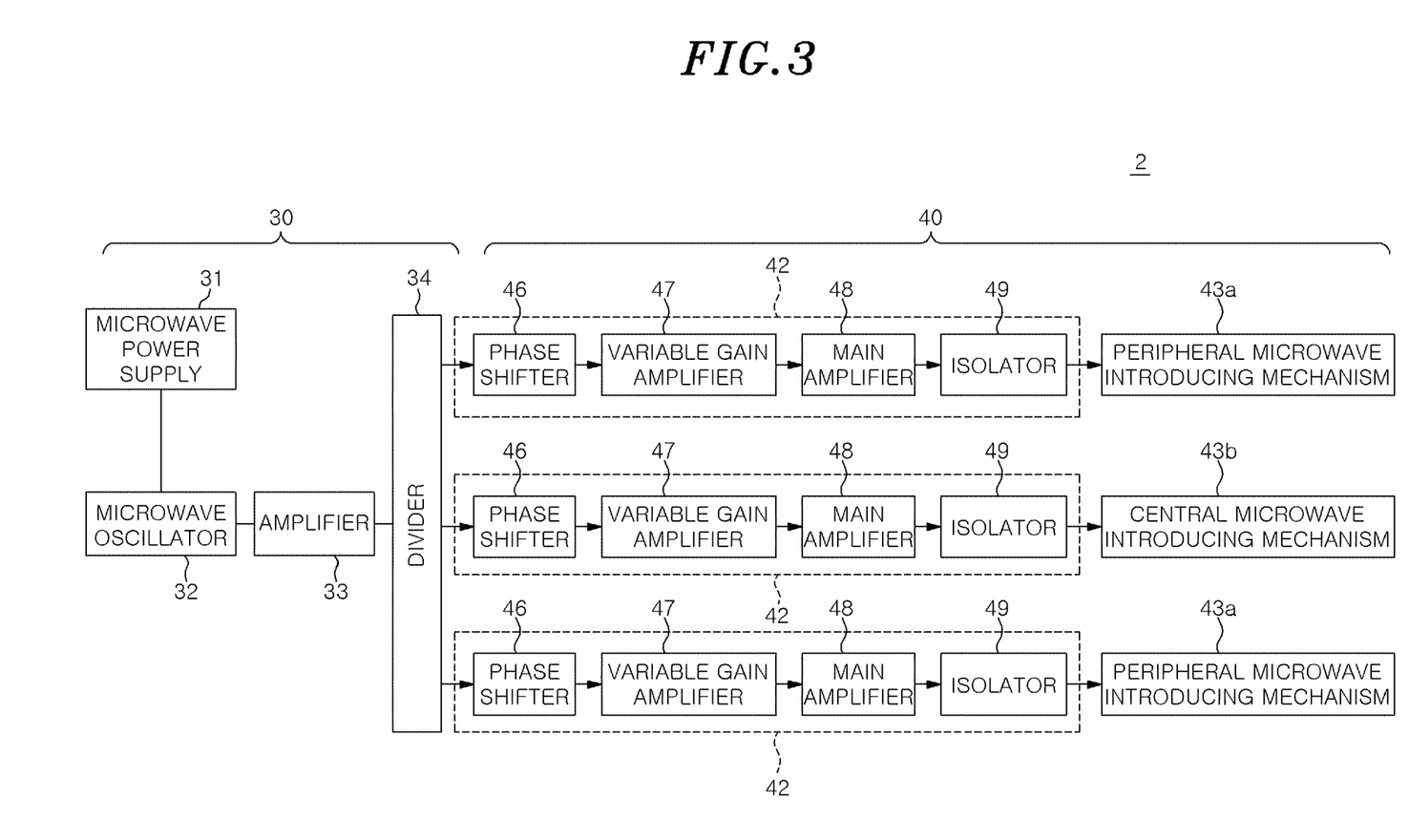
FIG. 3 shows an example of a microwave plasma source according to an embodiment.

FIG. 3 shows an example of the microwave plasma source according to the embodiment. As shown in FIG. 3, the microwave output unit 30 of the microwave plasma source 2 includes a microwave power supply 31, a microwave oscillator 32, an amplifier 33 for amplifying the oscillated microwave, and a divider 34 for dividing the amplified microwave into a plurality of microwaves.

The microwave oscillator 32 oscillates the microwave at a predetermined frequency by using, e.g., a phase locked loop (PLL). The divider 34 divides the microwave amplified by the amplifier 33 while matching an impedance between an input side and an output side to minimize the loss of the microwaves. The frequency of the microwaves may be within a range of 700 MHz to 3 GHz.

The microwave transmitting unit 40 includes the plurality of amplifier units 42, and the peripheral microwave introducing mechanisms 43a and the central microwave introducing mechanism 43b disposed to correspond to the plurality of amplifier units 42. The amplifier units 42 guide the microwaves divided by the divider 34 to the peripheral microwave introducing mechanisms 43a and the central microwave introducing mechanism 43b. Each of the amplifier units 42 includes a phase shifter 46, a variable gain amplifier 47, a main amplifier 48 constituting a solid state amplifier, and an isolator 49.

The phase shifter 46 is configured to modulate the radiation characteristics by shifting the phase of the microwaves. For example, the directivity can be controlled by adjusting the phases of the microwaves introduced into the peripheral microwave introducing mechanisms 43a and the central microwave introducing mechanism 43b to thereby change the plasma distribution. Further, circularly polarized waves can be obtained by shifting the phase by 90° between adjacent microwave introducing mechanisms. The phase shifter 46 can also be used to control delay characteristics between components in the amplifier and perform spatial combination in a tuner. However, the phase shifter 46 may not be provided when it is unnecessary to modulate the radiation characteristics or to control the delay characteristics between the components in the amplifier.

The variable gain amplifier 47 controls the power levels of the microwaves to be inputted to the main amplifier 48 and adjusts a plasma intensity. By controlling the variable gain amplifier 47 for each of antenna modules, it is possible to adjust the distribution of the generated plasma.

The main amplifier 48 constituting the solid state amplifier has, e.g., an input matching circuit, a semiconductor amplifying device, an output matching circuit, and a high Q resonance circuit. The isolator 49 separates reflected microwaves that are reflected by a slot antenna unit and directed toward the main amplifier 48. The isolator 49 includes a circulator and a dummy load (coaxial terminator). The circulator guides the reflected microwaves to the dummy load, and the dummy load converts the reflected microwaves guided by the circulator into heat. The peripheral microwave introducing mechanisms 43a and the central microwave introducing mechanism 43b introduce the microwaves outputted from the amplifier units 42 into the microwave radiating mechanisms 50.

(Probe)

Figure 4:
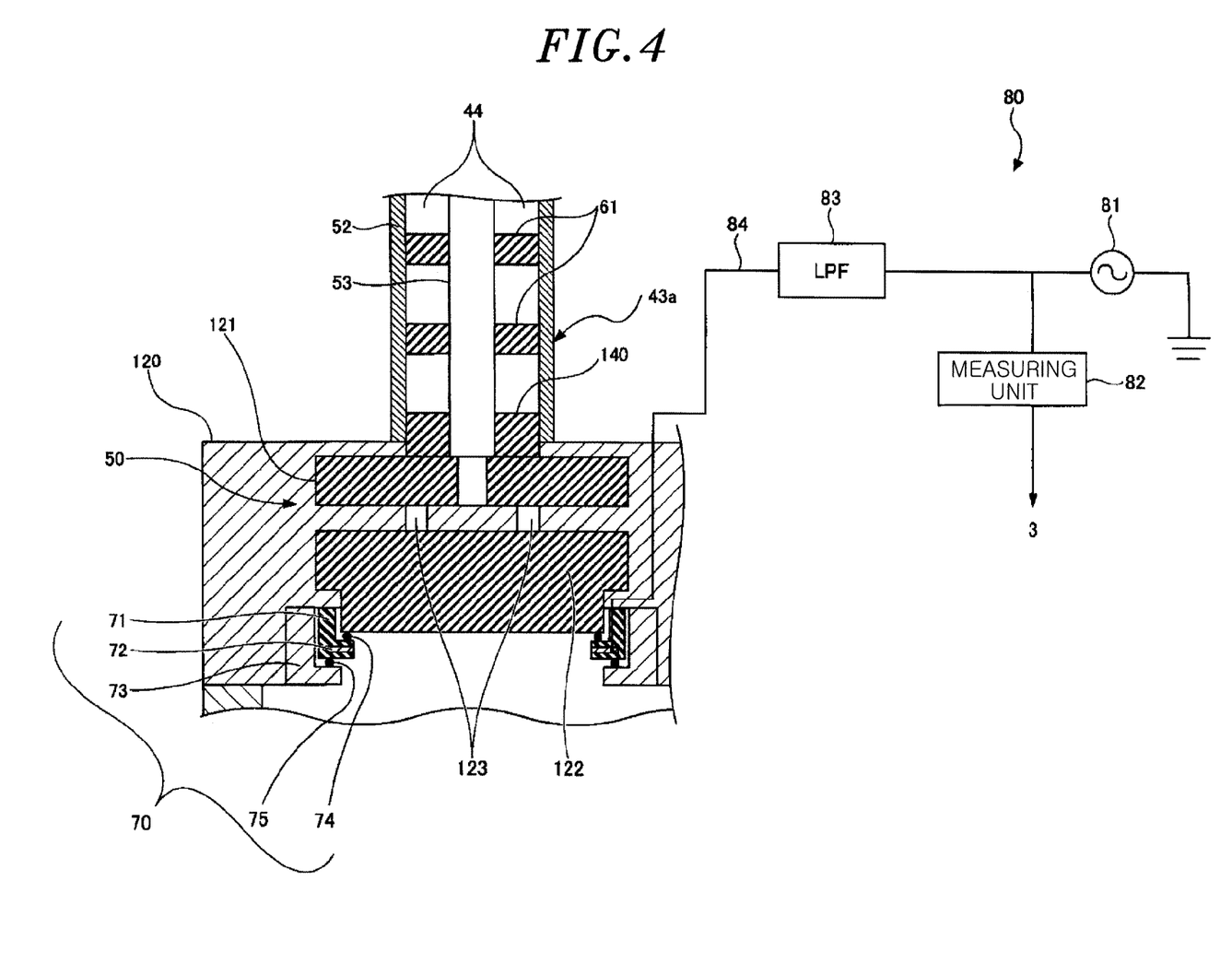
FIG. 4 shows an example of a probe of the microwave plasma processing apparatus shown in FIG. 1.

FIG. 4 shows an example of the probe of the microwave plasma processing apparatus shown in FIG. 1. FIG. 4 is an enlarged view of the probe 70 provided to correspond to the microwave radiating mechanism 50 connected to one of the six peripheral microwave introducing mechanisms 43a. The probes 70 provided to correspond to the microwave radiating mechanisms 50 connected to the other peripheral microwave introducing mechanisms 43a and the central microwave introducing mechanism 43b have the same configuration as that shown in FIG. 4.

The probe 70 includes an insulator ring 71, a conductive sheet 72, a holder 73, and sealing members 74 and 75.

The insulator ring 71 is disposed at an outer peripheral portion of the microwave transmitting member 122. The insulator ring 71 is an annular insulating member having an inner diameter smaller than an outer diameter of the microwave transmitting member 122 and an outer diameter greater than an outer diameter of the microwave transmitting member 122. The insulator ring 71 is disposed to cover a part of a bottom surface of the microwave transmitting member 122. The sealing member 74 such as an O-ring is disposed between the insulator ring 71 and the bottom surface of the microwave transmitting member 122 to hermetically seal the gap therebetween. The insulator ring 71 is made of a ceramic such as alumina ($Al_2O_3$), aluminum nitride (AlN), or the like.

The conductive sheet 72 is embedded in the insulator ring 71. The conductive sheet 72 has, e.g., an annular shape, and extends along the circumferential direction of the insulator ring 71. Preferably, the conductive sheet 72 is completely embedded in the insulator ring 71. Accordingly, it is possible to avoid metal contamination in the chamber 1 caused by the conductive sheet 72 during the plasma processing and further to suppress generation of particles. The conductive sheet 72 may be partially exposed from the insulator ring 71. The conductive sheet 72 is connected to a power feed line 84 of a plasma detector 80 to be described later. The conductive sheet 72 may have, e.g., a film shape or a mesh shape. The conductive sheet 72 is made of a metal such as aluminum (Al) or the like.

The holder 73 is disposed at an outer peripheral portion of the insulator ring 71. The holder 73 is an annular member having an inner diameter smaller than the outer diameter of the insulator ring 71 and an outer diameter greater than the outer diameter of the insulator ring 71. The holder 73 is disposed to cover a part of a bottom surface of the insulator ring 71. The sealing member 75 such as an O-ring is disposed between the holder 73 and the bottom surface of the insulator ring 71 to hermetically seal the gap therebetween. The holder 73 is fixed to a bottom surface of the main body 120 to hold the insulator ring 71 at the outer peripheral portion of the microwave transmitting member 122. The holder 73 is made of, e.g., a metal such as Al or the like.

The plasma detector 80 includes an AC power supply 81, a measuring unit 82, and a low pass filter 83.

The AC power supply 81 is connected to the conductive sheet 72 of the probe 70 through the power feed line 84. The AC power supply 81 applies an AC voltage to the conductive sheet 72 through the power feed line 84 under the control of the controller 3. The AC voltage has a voltage value of, e.g., several V, and a frequency of, e.g., several tens of kHz. The AC power supply 81 may be provided for each of the seven probes 70, or one common AC power supply 81 may be provided for the seven probes 70.

When the AC voltage is applied from the AC power source 81 to the conductive sheet 72 through the power feed line 84, the measuring unit 82 measures the current flowing through the conductive sheet 72 during the plasma processing via the power feed line 84. At this time, since the conductive sheet 72 is embedded in the insulator ring 71, the conductive sheet 72 is electrically insulated from the main body 120 and the holder 73 by the insulator ring 71. Accordingly, the electric current (floating current) flowing from the conductive sheet 72 to the main body 120 and the holder 73 is reduced, so that the measurement sensitivity (S/N ratio) of the measuring unit 82 is improved.

The low pass filter 83 is disposed in the power feed line 84. The low pass filter 83 is configured to remove unnecessary radio frequency components of the AC current flowing through the power feed line 84 in order to prevent unnecessary harmonic components from flowing into the measuring unit 82 through the power feed line 84. Further, a capacitor may be disposed in the power feed line 84.

In the plasma detector, when the AC voltage is applied from the AC power supply 81 to the conductive sheet 72 of the probe 70 under the control of the controller 3, the measuring unit 82 measures the current flowing through the conductive sheet 72 during the plasma processing via the power feed line 84. The current flowing through the conductive sheet 72 is equivalent to the current flowing through the plasma generated in the chamber 1. Therefore, the state of the plasma generated in the chamber 1 can be detected by measuring the current flowing through the conductive sheet 72 during the plasma processing.

The measuring unit 82 transmits a signal indicating a waveform of the measured current to the controller 3. When the signal is received, the microprocessor 4 of the controller 3 obtains the plasma state by Fourier-transforming and analyzing the waveform of the current included in the signal. The plasma state includes, e.g., an electron density Ne and an electron temperature Te. Accordingly, the plasma state below each of the six microwave transmitting members 122 and the microwave transmitting member 132 can be monitored in real time. As a result, it is possible to detect temporal changes of the plasma state or variation in the in-plane distribution of the plasma during the plasma processing.

The microprocessor 4 controls the output (power) of the microwave introduced into the chamber 1 from the peripheral microwave introducing mechanism 42a corresponding to the probe 70 used for measurement in real time during the plasma processing depending on the electron density Ne and the electron temperature Te obtained based on the measurement result using the probe 70. Specifically, the microprocessor 4 controls the variable gain amplifier 47 of the amplifier unit 42 that outputs the microwave to the corresponding peripheral microwave introducing mechanism 43a depending on the obtained electron density Ne and the obtained electron temperature Te of the plasma, and adjusts the power level of the microwave to be inputted to the main amplifier 48. Accordingly, the plasma distribution is changed by adjusting the plasma intensity of the microwave introduced into the corresponding peripheral microwave introducing mechanism 43a.

Further, the microprocessor 4 controls the phase of the microwave propagating through the peripheral microwave introducing mechanism 43a corresponding to the probe 70 used for measurement in real time depending on the obtained electron density Ne and the obtained electron temperature Te of the plasma. Specifically, the microprocessor 4 controls the phase shifter 46 of the amplifier unit 42 that outputs the microwave to the corresponding peripheral microwave introducing mechanism 43a depending on the obtained electron density Ne and the obtained electron temperature Te of the plasma, and modulates the radiation characteristics by changing the phase of the microwave. Accordingly, the directivity is controlled by adjusting the phase of the microwave introduced into the corresponding peripheral microwave introducing mechanism 43a to thereby change the plasma distribution.

As described above, in one embodiment, the microwave power and the microwave phase are controlled together. However, at least one of the microwave power and the microwave phase may be controlled. However, it is preferred to control both of the microwave power and the microwave phase.

Figure 5:
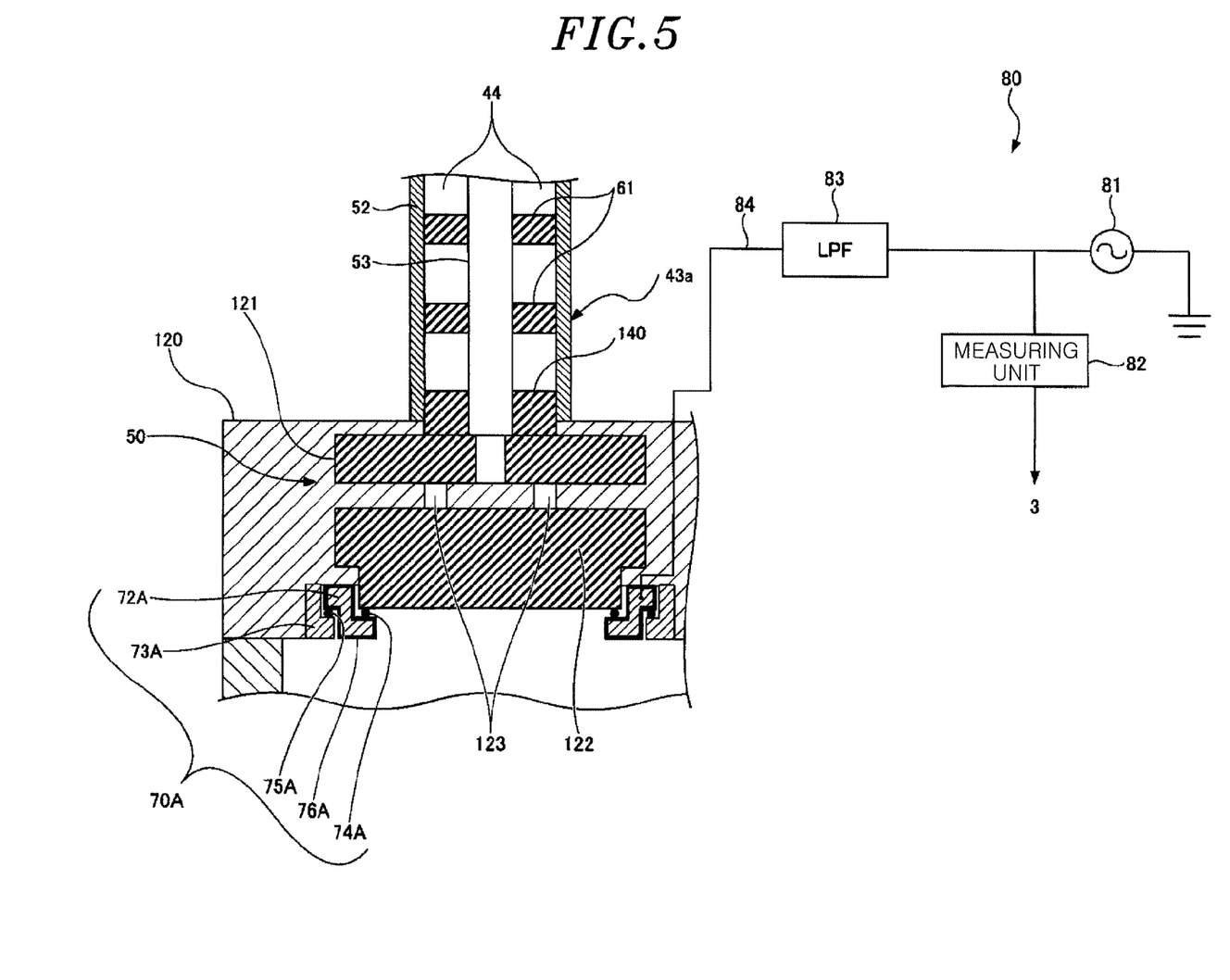
FIG. 5 shows another example of the probe of the microwave plasma processing apparatus shown in FIG. 1.

FIG. 5 shows another example of the probe of the microwave plasma processing apparatus shown in FIG. 1. FIG. 5 is an enlarged view of a probe 70A provided to correspond to the microwave radiating mechanism 50 connected to one of the six peripheral microwave introducing mechanisms 43a. The probes 70A provided to correspond to the microwave radiating mechanisms 50 connected to the other peripheral microwave introducing mechanisms 43a and the central microwave introducing mechanism 43b have the same configuration as that shown in FIG. 5.

The probe 70A includes a conductor ring 72A, a holder 73A, and sealing members 74A and 75A.

The conductor ring 72A is disposed at an outer peripheral portion of the microwave transmitting member 122. The conductor ring 72A is a conductive annular member having an inner diameter smaller than the outer diameter of the microwave transmitting member 122 and an outer diameter greater than the outer diameter of the microwave transmitting member 122. The conductor ring 72A is disposed to cover a part of the bottom surface of the microwave transmitting member 122. The sealing member 74A such as an O-ring is disposed between the conductor ring 72A and the bottom surface of the microwave transmitting member 122 to hermetically seal the gap therebetween. A bottom surface of the conductor ring 72A has the same height or substantially the same height as that of the bottom surface of the main body 120. The conductor ring 72A is made of a metal such as Al or the like, and an insulating film 76A is formed on the surface of the metal. Therefore, the conductor ring 72A is insulated from the main body 120 and the holder 73A. The insulating film 76A is formed by insulating treatment such as alumite treatment or thermal spraying of an insulating material. The power feed line 84 of the plasma detector 80 is connected to the conductor ring 72A.

The holder 73A is disposed at an outer peripheral portion of the conductor ring 72A. The holder 73A is an annular member having an inner diameter smaller than the outer diameter of the conductor ring 72A and an outer diameter greater than the outer diameter of the conductor ring 72A. The holder 73A is disposed to cover a part of the bottom surface of the conductor ring 72A. The sealing member 75A such as an O-ring is disposed between the holder 73A and the bottom surface of the conductor ring 72A to hermetically seal the gap therebetween. The holder 73A is fixed to the bottom surface of the main body 120 to hold the conductor ring 72A at the outer peripheral portion of the microwave transmitting member 122. The holder 73A is made of a metal such as Al or the like.

The plasma detector 80 includes the AC power supply 81, the measuring unit 82, and the low-pass filter 83, similarly to the example shown in FIG. 4.

In the example of FIG. 5, when the AC voltage is applied from the AC power supply 81 to the conductor ring 72A of the probe 70A under the control of the controller 3, the measuring unit 82 measures the current flowing through the conductor ring 72A during the plasma processing via the power feed line 84. The current flowing through the conductor ring 72A is equivalent to the current flowing through the plasma generated in the chamber 1. Therefore, the state of the plasma generated in the chamber 1 can be detected by measuring the current flowing through the conductor ring 72A during the plasma processing.

Figure 6:
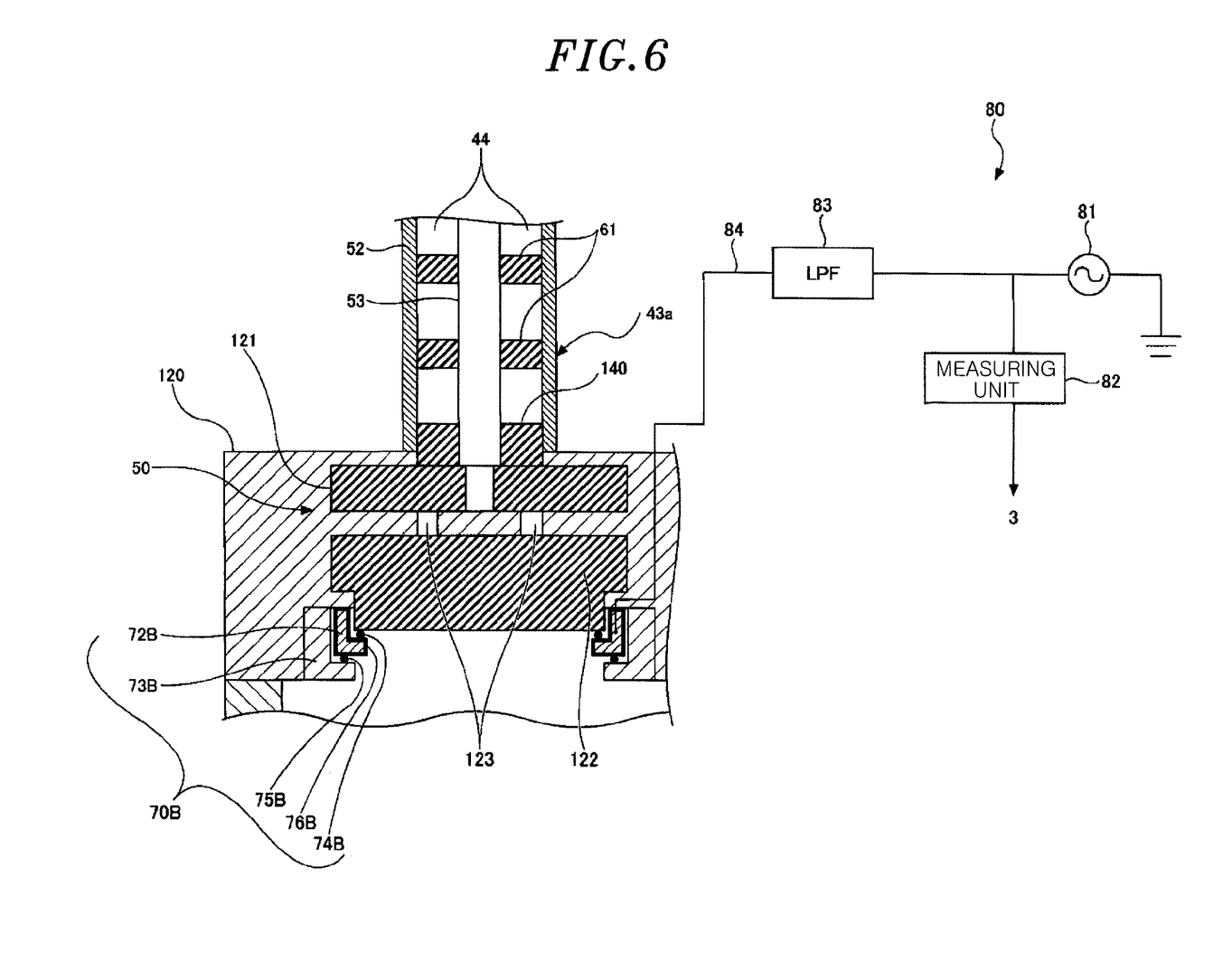
FIG. 6 shows still another example of the probe of the microwave plasma processing apparatus shown in FIG. 1.

FIG. 6 shows still another example of the probe of the microwave plasma processing apparatus shown in FIG. 1. FIG. 6 is an enlarged view of a probe 70B provided to correspond to the microwave radiating mechanism 50 connected to one of the six peripheral microwave introducing mechanisms 43a. The probes 70B provided to correspond to the microwave radiating mechanisms 50 connected to the other peripheral microwave introducing mechanisms 43a and the central microwave introducing mechanism 43b have the same configuration as that shown in FIG. 6.

The probe 70B includes a conductor ring 72B, a holder 73B, and sealing members 74B and 75B.

The conductor ring 72B is disposed at an outer peripheral portion of the microwave transmitting member 122. The conductor ring 72B is the conductive annular member having an inner diameter smaller than the outer diameter of the microwave transmitting member 122 and an outer diameter greater than the outer diameter of the microwave transmitting member 122. The conductor ring 72B is disposed to cover a part of the bottom surface of the microwave transmitting member 122. The sealing member 74B such as an O-ring is disposed between the conductor ring 72B and the bottom surface of the microwave transmitting member 122 to hermetically seal the gap therebetween. A bottom surface of the conductor ring 72B is located above the bottom surface of the main body 120, and the bottom surface of the conductor ring 72B is held by the holder 73B. The conductor ring 72B is made of, e.g., a metal such as Al or the like, and an insulating film 76B is formed on the surface of the metal. Accordingly, the conductor ring 72B is insulated from the main body 120 and the holder 73B. The insulating film 76B is formed by insulating treatment such as alumite treatment or thermal spraying of an insulating material. The conductor ring 72B is connected to the power feed line 84 of the plasma detector 80.

The holder 73B is disposed at an outer peripheral portion of the conductor ring 72B. The holder 73B is an annular member having an inner diameter smaller than an outer diameter of the conductor ring 72B and an outer diameter greater than the outer diameter of the conductor ring 72B. The holder 73B is disposed cover a part of the bottom surface of the conductor ring 72B. The sealing member 75B such as an O-ring is disposed between the holder 73B and the bottom surface of the conductor ring 72B to hermetically seal the gap therebetween. The holder 73B is fixed to the bottom surface of the main body 120 to hold the bottom surface of the conductor ring 72B and fix the conductor ring 72B at the outer peripheral portion of the microwave transmitting member 122. The holder 73B is made of a metal such as Al or the like.

The plasma detector 80 includes the AC power supply 81, the measuring unit 82, and the low pass filter 83, similarly to the example shown in FIG. 4.

In the example of FIG. 6, when the AC voltage is applied from the AC power source 81 to the conductor ring 72B of the probe 70B under the control of the controller 3, the measuring unit 82 measures the current flowing through the conductor ring 72B during the plasma processing via the power feed line 84. The current flowing through the conductor ring 72B is equivalent to the current flowing through the plasma generated in the chamber 1. Therefore, the state of the plasma generated in the chamber 1 can be detected by measuring the current flowing through the conductor ring 72B during the plasma processing.

As described above, in the microwave plasma processing apparatus 100, the conductive annular member (e.g., the conductive sheet 72, the conductor rings 72A and 72B) is disposed in the chamber 1, so that the state of the plasma generated in the chamber 1 can be monitored. Further, since the microwave radiating mechanism 50 is disposed to be coaxial with the center of the conductive annular member, the state of the plasma near the microwave radiating mechanism 50 can be monitored.

Meanwhile, a method of monitoring the state of the plasma in the chamber 1 by inserting a rod-shaped probe into the chamber 1 through the ceiling plate or the sidewall of the chamber 1 has been suggested. However, if the rod-shaped probe is inserted into a plasma space, plasma disturbance may occur and affect the processing. On the other hand, in the microwave plasma processing apparatus 100 according to the embodiment, the conductive annular member is used, so that the plasma is not shielded and the occurrence of plasma disturbance can be suppressed.

In the above embodiment, the chamber 1 is an example of the processing chamber, and the conductive sheet 72 and the conductor rings 72A and 72B are examples of the conductive annular member.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, the microwave plasma processing apparatus of the present disclosure may be used to monitor a film thickness. Specifically, a film is formed on the probes during the plasma processing, so that the waveform of the current flowing through each probe measured by the measuring unit is changed. Therefore, the controller of the microwave plasma processing apparatus of the present disclosure can estimate a thickness of a film formed on the probes by analyzing changes in the intensity of the signal obtained from each probe. Accordingly, the state in the chamber can be detected.

Further, the microwave plasma processing apparatus of the present disclosure may be used to determine the cleaning timing of the chamber for removing deposits adhered to the inner wall of the chamber 1 by monitoring the estimated thickness of the film formed on the probe. Further, the cleaning end time of the chamber may be detected by monitoring the estimated thickness of the film formed on the probe during the cleaning of the chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A plasma processing apparatus comprising:
    a processing chamber having a ceiling plate with at least one opening;
    at least one conductive annular member respectively disposed at said at least one opening while being insulated from the ceiling plate, wherein each of the at least one conductive annular member is disposed in a concave portion of each of the at least one opening;
    at least one microwave radiating mechanism respectively disposed on the ceiling plate to be coaxial with a center of each of said at least one conductive annular member and configured to radiate microwaves into the processing chamber; and
    a plasma detector connected to each of said at least one conductive annular member and configured to detect a state of generated plasma.

2. The plasma processing apparatus of claim 1, wherein the plasma detector detects the state of the plasma by applying an AC voltage to each of said at least one conductive annular member and measuring a current flowing through each of said at least one conductive annular member.

3. The plasma processing apparatus of claim 1, wherein each of said at least one conductive annular member is embedded in an insulating member supported by the ceiling plate.

4. The plasma processing apparatus of claim 3, wherein each of said at least one conductive annular member has a film shape or a mesh shape.

5. The plasma processing apparatus of claim 1, wherein each of said at least one conductive annular member is supported by the ceiling plate.

6. The plasma processing apparatus of claim 1, wherein each of said at least one conductive annular member is made of a metal, and an insulating film is formed on a surface of the metal.

7. The plasma processing apparatus of claim 2, wherein each of said at least one conductive annular member is made of a metal, and an insulating film is formed on a surface of the metal.

8. The plasma processing apparatus of claim 5, wherein each of said at least one conductive annular member is made of a metal, and an insulating film is formed on a surface of the metal.

9. The plasma processing apparatus of claim 5, wherein a bottom surface of each of said at least one conductive annular member is disposed above a bottom surface of the ceiling plate or has the same height or substantially the same height as a height of a bottom surface of the ceiling plate.

10. The plasma processing apparatus of claim 6, wherein a bottom surface of each of said at least one conductive annular member is disposed above a bottom surface of the ceiling plate or has the same height or substantially the same height as a height of a bottom surface of the ceiling plate.

11. The plasma processing apparatus of claim 1, wherein the state of the plasma includes at least one of an electron density and an electron temperature of the plasma.

12. The plasma processing apparatus of claim 1, further comprising:
    a controller configured to control conditions of plasma processing based on the state of the plasma detected by the plasma detector during the plasma processing.

13. The plasma processing apparatus of claim 12, wherein the conditions of the plasma processing include an output of the microwaves.

14. The plasma processing apparatus of claim 1, wherein said at least one opening includes two or more openings formed at the ceiling plate,
    said at least one conductive annular member includes two or more conductive annular members respectively disposed at the openings while being insulated from the ceiling plate, and
    the plasma detector detects the state of the plasma corresponding to each of the conductive annular members by measuring a current flowing through the corresponding conductive annular member to detect changes in in-plane distribution of the state of the plasma.

15. The plasma processing apparatus of claim 14, wherein the openings are arranged along a circumferential direction of the ceiling plate.

* * * * *